United States Patent [19]

Maruyama et al.

[11] 4,300,234
[45] Nov. 10, 1981

[54] ADDRESS PATTERN GENERATOR FOR TESTING A MEMORY

[75] Inventors: Hiromi Maruyama; Takashi Tokuno; Masao Shimizu, all of Gyoda; Kohji Ishikawa, Funabashi; Naoaki Narumi, Tokyo; Osamu Ohguchi, Sayama, all of Japan

[73] Assignees: Nippon Telegraph and Telephone Public Corporation; Takeca Riken Kogyo Kabushiki Kaisha, both of Tokyo, Japan

[21] Appl. No.: 83,527

[22] Filed: Oct. 10, 1979

[30] Foreign Application Priority Data

Oct. 11, 1978 [JP] Japan ................... 53-124910

[51] Int. Cl.³ ................................. G01R 31/28
[52] U.S. Cl. ................... 371/27; 324/73 R; 364/900; 371/21
[58] Field of Search ............. 371/21, 27, 25; 324/73 R, 73 AT; 364/900

[56] References Cited
U.S. PATENT DOCUMENTS 3,751,649  8/1973  Hart, Jr. ........................ 371/21
3,892,955  7/1975  Maejima ........................ 371/21
3,940,601  2/1976  Henry et al. ................... 371/21
3,961,251  6/1976  Hurley et al. ............... 324/73 AT
4,055,754  10/1977  Chesley ....................... 371/21
4,061,908  12/1977  de Jonge et al. .............. 371/21
4,079,453  3/1978  Dahl ........................... 364/200
4,195,770  4/1980  Benton et al. ................. 371/21

Primary Examiner—Charles E. Atkinson
Attorney, Agent, or Firm—Staas & Halsey

[57] ABSTRACT

An address pattern generator for use in a test pattern generator for generating various patterns for testing semiconductor memories. A plurality of fixed registers for storing an initial value at the start of a test, a boundary value and an operand indicating the amount of change of an address are provided in common to at least two address operating circuits. The address operating circuits are each capable of taking therein the content of a desired one of the fixed registers. At least two output registers are provided, which are each capable of taking therein the operation result of a desired one of the address operating circuit. The contents of these output registers are supplied as addresses to a memory under test.

6 Claims, 9 Drawing Figures

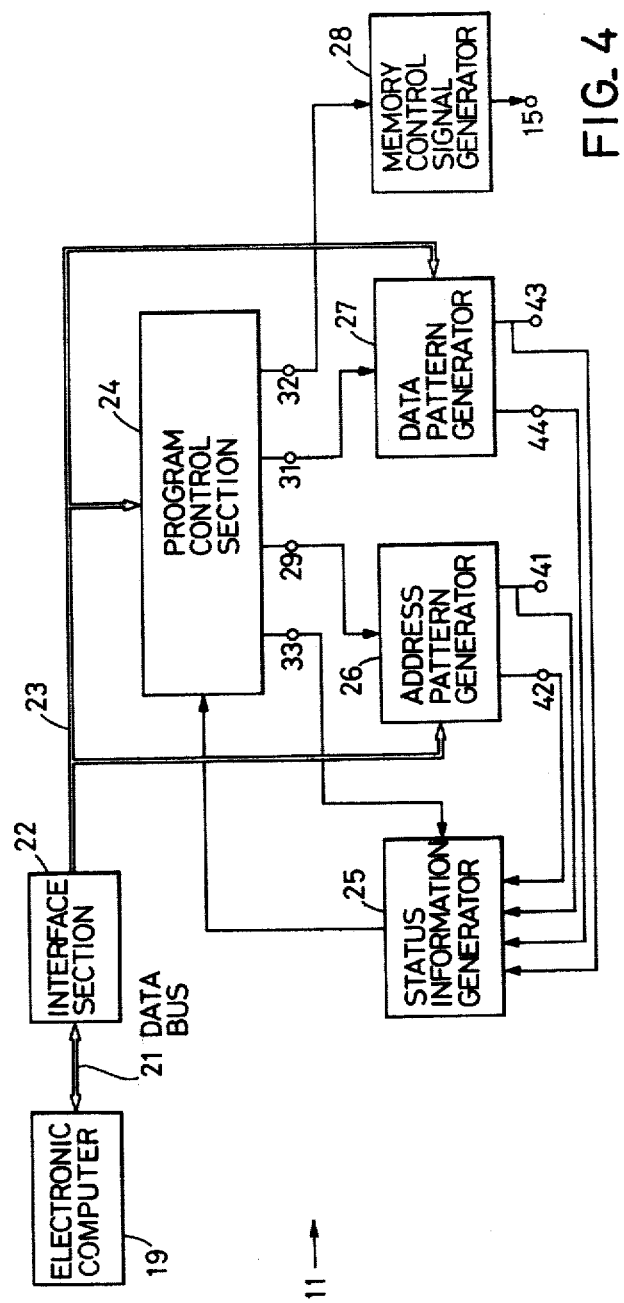
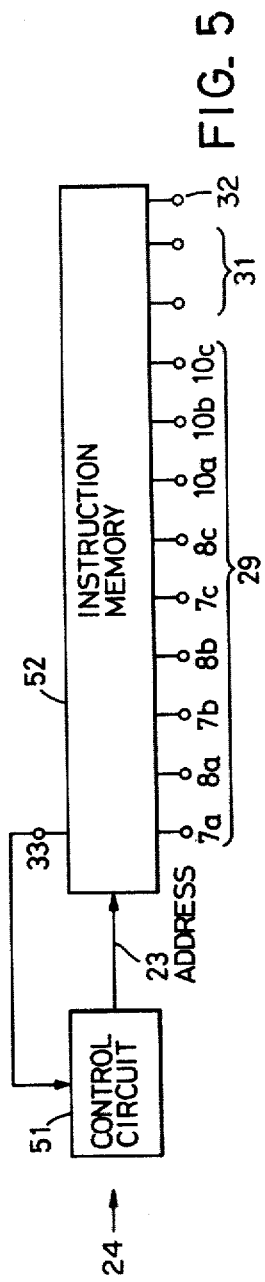
FIG. 4
FIG. 5

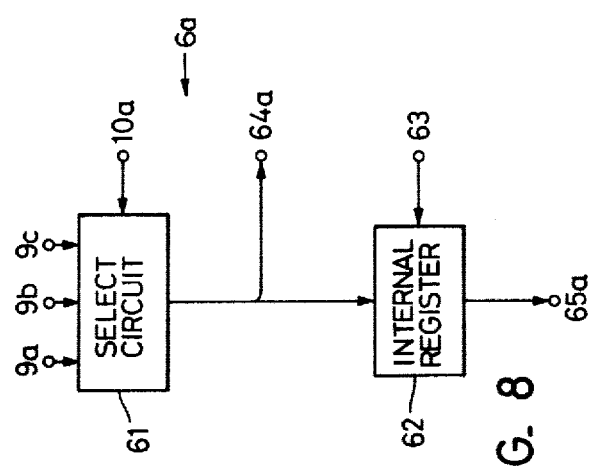
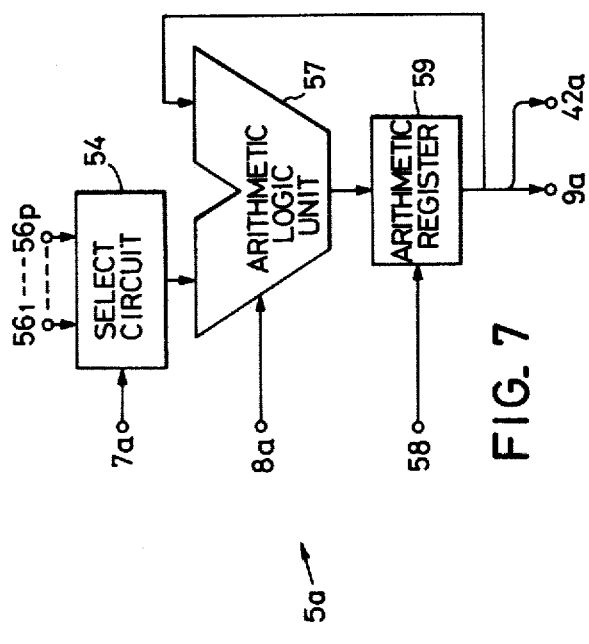
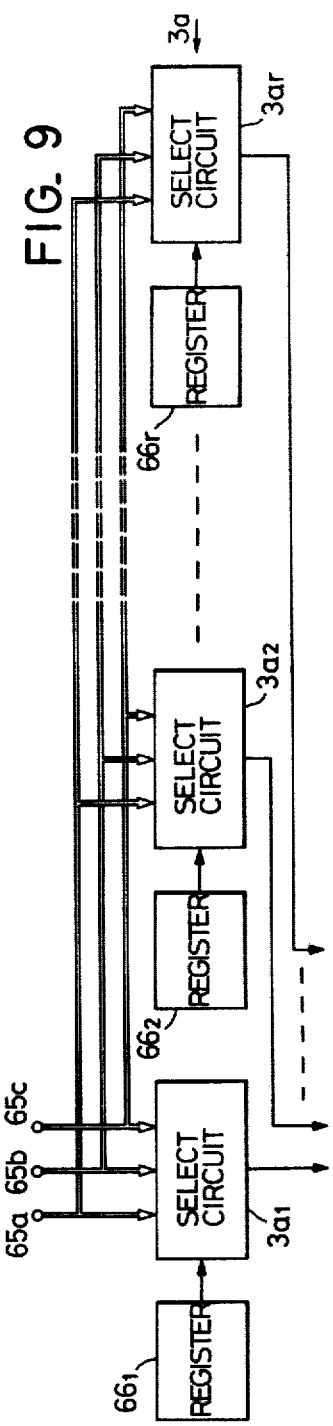
FIG. 8
FIG. 7
FIG. 9

ADDRESS PATTERN GENERATOR FOR TESTING A MEMORY

BACKGROUND OF THE INVENTION

This invention relates to a pattern generator for generating an address pattern for testing a memory such as, for example, a random access memory.

A random access memory permits arbitrary read and write at any address, as is well-known in the art, but this kind of memory may in some cases be fabricated with some memory cells remaining defective, due, for example, to a defect of a semiconductor substrate. The defective cells cause various malfunctions in the operation of the memory. The malfunction that data can neither be written in nor read from the memory can easily be found out; but, sometimes a malfunction occurs wherein, although the memory operates normally when accessed in the sequential order of arrangement of the cells, it does not operate normally when accessed from a remote address. To detect such a malfunction, it is necessary to operate the memory cells in various patterns possible in actual working conditions and to check whether the operation is normal or not. To this end, there has heretofore been proposed a pattern generator to generate the test patterns necessary for various tests, such as walking, galloping and so forth.

A memory is usually adapted so that each particular memory cell is selected by a row address pattern and a column address pattern. The conventional address pattern generator has a row address pattern generator and a column address pattern generator; these address pattern generators are each provided with one or more address operating circuits; and these address operating circuits each have fixedly connected thereto two fixed registers respectively having loaded therein an initial value or boundary value and an operand. The initial value corresponds to the address of the memory cell which is accessed first when starting a test. The boundary value is a final value of a row address, for example, in the case where the column address is fixed where row addresses are successively changed and the column address is changed only when a certain row address is reached. The operand is a constant number by which an address is increased.

In the prior art address pattern generator, since the two fixed registers are individually connected to the address operating circuit, as described above, modification of a changing format of the address pattern generated calls for modification of the contents of the fixed registers; especially, in the case of an address pattern changing complicatedly, it is necessary to modify the contents of the fixed registers during the test. This modification requires at least one operation cycle of the pattern generator, and during the modification, the test of the memory is interrupted. That is to say, there occurs what is called a dummy cycle, and as a result of this, the time for the test increases accordingly. During interruption of the test, the content of the memory may sometimes vary, making the test incorrect. Further, in the conventional address pattern generator, the row and column address pattern generators are provided independently for producing row and column address patterns respectively. Therefore, for the address operation, arithmetic circuits are required which have a scale of the number of bits of each of the row and column address patterns, and in the case of dividing the memory under test into a plurality of memory parts and successively accessing the same addresses within the respective memory parts, formation of the pattern may become relatively complicated, resulting in a dummy cycle.

An object of this invention is to provide an address pattern generator which is capable of generating even complicated patterns without introducing any dummy cycle.

Another object of this invention is to provide an address pattern generator which is capable of generating complicatedly changing patterns on a relatively small operation scale and with simple operations.

SUMMARY OF THE INVENTION

In accordance with the present invention, a plurality of fixed registers for storing an initial value, a boundary value and an operand are provided in common to at least two address operating circuits, which are each adapted to be capable of taking therein a value stored in a desired one of the fixed registers. Thus, a register of an operand 1, for example, can be employed not only for sequentially increasing or decreasing the row address by 1 but also for sequentially increasing or decreasing the column address by 1. Therefore, the number of fixed registers used can be reduced accordingly, and various address patterns can be generated with a relatively small number of fixed registers.

Further, the arrangement of the invention permits the operation result of each address operating circuit to be loaded in a desired one of at least two output registers. The contents of these output registers are applied as row and column address patterns to a memory under test. By loading the operation result of the desired one of the address operating circuits in any of the output registers as described, flexibility of the address pattern generation is increased.

Three such output registers are provided; first and second ones of them are used for the row and the column address, respectively, and the remaining third one is used in common to the both addresses. The content of the third output register is combined with the high-order bit of each of the addresses, by which, in the case of testing the memory under test for each of its plurality of memory parts, the third output register can be employed for selecting each of the memory parts. This simplifies the address operation and permits generation of even complicated patterns without introducing any dummy cycles.

BRIEF DESCRIPTION OF THE DRAWINGS

FIG. 4 is a block diagram illustrating one part of a test pattern generating apparatus;

FIG. 5 is a block diagram showing one part of a program control section 24 utilized in FIG. 4;

FIG. 7 is a block diagram showing an example of an address operating circuit 5a used in FIG. 6;

FIG. 8 is a block diagram showing an example of an output register 6a used in FIG. 6; and FIG. 9 is a block diagram showing an example of a drive circuit 3a utilized in FIG. 6.

DESCRIPTION OF THE PREFERRED EMBODIMENTS

Figure 1:
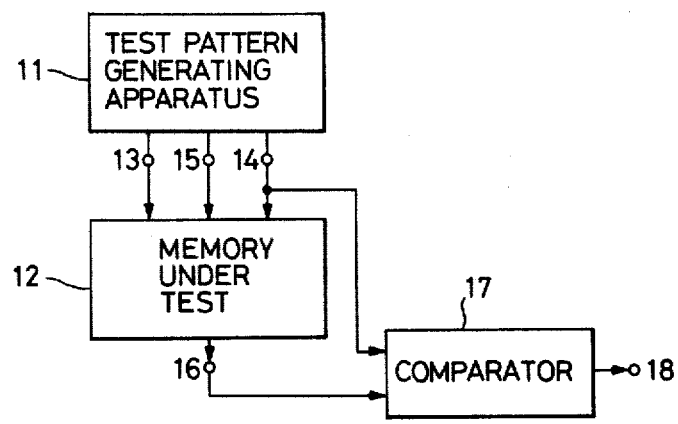
FIG. 1 is a block diagram illustrating the arrangement for testing a memory.

An address pattern generator of this invention is used, for example, in a test pattern generating apparatus for testing semiconductor memories. With reference to FIG. 1, the test pattern generating apparatus will be first described briefly. A test pattern generating apparatus 11 provides, at a terminal 13 an address pattern for address assignment of a memory 12 under test, and, at a terminal 14, data which is written in the memory 12 at an address accessed by the address pattern. In the case where the data has been written in the memory 12 under test and the address of the memory 12 assigned by the address provided at the terminal is to be read, expected value data is provided at the terminal 14 for checking whether the read-out data is correct or not. The write and read of the memory 12 under test is controlled by a memory control signal which is provided at a terminal 15. A comparison is made by a comparator 17 between the data derived at a terminal 16 of the memory 12 under test and the expected value pattern provided at the terminal 14 of the test pattern generating apparatus 11, and, in the case of non-coincidence, the comparator 17 produces at its terminal 18 a signal indicating malfunction of the memory 12 under test.

Figure 3:
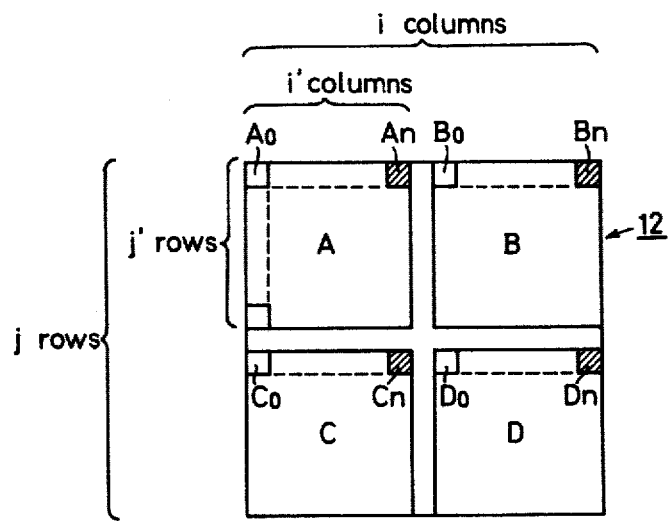
FIG. 3 is a diagram showing the relationship between a memory under test and memory parts into which the memory is divided.
Figure 2:
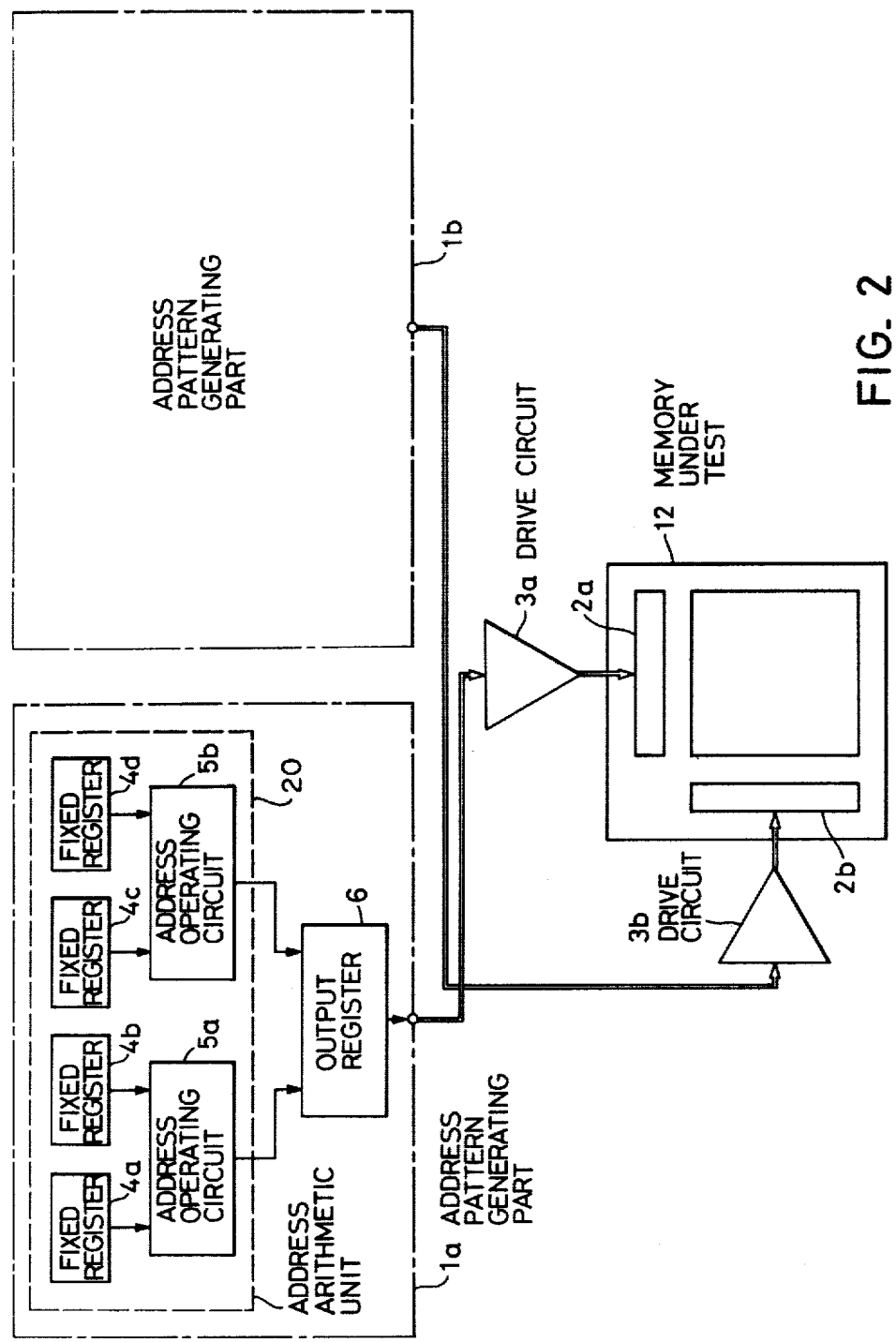
FIG. 2 is a block diagram showing a conventional address pattern generator.

The test pattern generating apparatus 11 includes an address pattern generator. FIG. 2 shows a conventional address pattern generator. Address patterns, which are applied to i columns and j rows of the memory 12 under test, are produced by pattern generating parts 1a and 1b respectively. Where the storage capacity of the memory 12 under test is large, the inside of the memory 12 is divided into a plurality of parts, and these individual parts are coupled together via address decoders and sense amplifiers and operate as if they were a single memory element. The memory 12 is usually divided, for example, into four memory parts A, B, C and D, as depicted in FIG. 3. The memory parts A, B, C and D are each formed by memory cells arranged in the form of a matrix having i' columns and j' rows. The address decoders are each a circuit for converting n-bit binary data into $2^n$ data lines; and address decoders 2a and 2b are provided for the columns and the rows respectively, as seen in FIG. 2. The address decoder 2a for the columns is supplied with an address pattern from the pattern generating part 1a via a drive circuit 3a, whereas the address decoder 2b for the rows is supplied with an address pattern from the pattern generating part 1b via a drive circuit 3b. The selection of the memory parts A to D is performed using high-order bits of the address patterns provided from the both address pattern generating parts 1a and 1b.

The address pattern generating part 1a has incorporated therein a plurality of fixed registers 4a, 4b, 4c and 4d, address operating circuits 5a and 5b, and an output register 6. The address operating circuits 5a and 5b suitably receive the fixed data set in fixed registers 4a, 4b and 4c, 4d, respectively, and operate on these data, and the operation results are transferred to the output register 6 to output therefrom an address pattern. One or more of the address operating circuits and the plurality of fixed registers make up an address operating unit 20. In concrete terms, initial values of addresses are respectively set in the fixed registers, for example, 4a and 4c, and values which are sequentially added to or subtracted from the initial value (that is, operands) are set in the other registers 4b and 4d. For example, at a moment m, the initial value set in the register 4a is applied to the address operating circuit 5a and then provided via the output register 6 to the memory 12 under test. At a moment m+1, the operand of the register 4b, for example, is applied to the address operating circuit 5a, wherein the operand is added to or subtracted from the initial value of the register 4a supplied previously, and the operation result is provided via the output register 6 to the memory 12 under test. At a moment m+2, the operand set in the register 4b is supplied again to the address operating circuit 5a, wherein the operand is further added to or subtracted from the previous operation result, and the operation result is outputted via the output register 6. In this way, an address pattern is generated. The address generating part 1b for the row is identical in construction with the address generating part 1a for the column, described above.

Since an increase in the number of the fixed registers 4a to 4b or the address operating circuits 5a and 5b leads to enlargement of the hardware structure, their numbers are limited, thus imposing a limitation on the number of different patterns which may be generated. For example, an address pattern for executing walking, galloping or the like can be generated, but in the case of generating a special address pattern requiring a plurality of operands, it is necessary to modify the values of the fixed registers 4a to 4d on a real time basis. During replacement of the data in the fixed register, the generation of the address pattern is interrupted; namely, there occurs what is called a dummy cycle. As a consequence, the test time becomes longer, and in the dummy cycle, the content of the memory under test may vary in some cases, resulting in an incorrect test being conducted. For example, it is difficult to generate such a pattern for sequentially accessing the same addresses An, Bn, Cn and Dn of the memory parts A, B, C and D in the memory 12 under test. To avoid this, the number of fixed registers connected to each of the address operating circuits 5a and 5b may be increased; however, this leads to the defects of enlarged hardware structure and decreased efficiency of utilization of hardware.

Further, in the prior art, the column address pattern is applied to the memory 12 under test from the output register 6 of the column address pattern generating part 1a, and the row address pattern is supplied to the memory 12 from the output register of the row address pattern generating part 1b; namely, the column and the row address pattern are individually generated, so that the generation of these address patterns is relatively complicated. The test time can be reduced by dividing the memory 12 under test into the plurality of memory parts A to D, as shown in FIG. 3, and testing them individually. In the case where after a certain test is conducted on one memory part, for example, A, another memory part is subjected to the same test, however, it is necessary to change boundary values of the column and row from (0, i'), (0, j') to (i'+1, 2i'), (0, j'), and, to perform this, the aforesaid dummy cyclle is introduced. Moreover, the address operating circuits are required to have operating structures corresponding to the numbers of bits of the column and row address patterns, respectively.

Before entering into a description of the address pattern generator of this invention, the test pattern generating apparatus will be described in brief.

The test pattern generating apparatus 11 successively generates, in accordance with a program stored therein, sets of an address pattern, a data pattern and a memory control signal to test the memory 12 under test. The test pattern generating apparatus 11 is disclosed, for example, in U.S. application Ser. No. 26246 filed Apr. 2, 1979. One part of the test pattern generating apparatus set forth in the prior application is shown in FIG. 4. Data necessary for the operation of the test pattern generating apparatus 11 is provided from an external control unit, for instance, an electronic computer 19. The electronic computer 19 has the function of making a micro-program, for pattern generation by the test pattern generating apparatus 11, and the functions of transferring, when needed, the micro-program for the pattern generation and the data of an internal register necessary for the pattern generation to the test pattern generating apparatus 11 via a data bus 21, and reading out the content of the internal register of the test pattern generating apparatus 11.

The data transferred from the electronic computer 19 via the data bus 21 is applied via an interface section 22 to an internal bus 23 of the test pattern generating apparatus 11 and then provided to a register or a memory in the test pattern generating apparatus 11. When supplied by computer 19 with a signal for reading out an internal register of the test pattern generating apparatus 11, the interface 22 transfers to the electronic computer 19 the content of the register memory designated via the internal bus 23.

A program control section 24 in the test pattern generating apparatus 11 responds to the pattern generating program transferred from computer 19 via the internal bus 23 and status information from a status information generator 25 to apply pattern generate instructions from terminals 29, 31 and 32 to an address pattern generator 26, a data pattern generator 27 and a memory control signal generator 28, respectively.

The address pattern generator 26 responds to the pattern generate instruction applied thereto from the terminal 29 of the program control section 24 to generate by operation an address pattern to be applied to the memory under test and output the address pattern from a terminal 41. The address pattern thus derived from the terminal 41 and the content of an internal register of the address pattern generator 26 are transferred as program control data to the status information generator 25 from a terminal 42. The address pattern from the terminal 41 is supplied to the terminal 13 in FIG. 1.

The data pattern generator 27 responds to the pattern generate instruction applied thereto from the terminal 31 of the program control section 24 to generate a write data pattern and an expected value pattern to be supplied to the memory under test and produce the patterns at a terminal 43. The data pattern and the content of an internal register of the data pattern generator 27 are transferred from a terminal 44 to the status information generator 25. The data pattern at the terminal 43 is supplied to the terminal 14 in FIG. 1.

The memory control signal generator 28 responds to the pattern generate instruction applied thereto from the terminal 32 of the program control section 24 to derive at a terminal a read/write or like memory control signal to be provided to the memory under test.

Upon application of an operation start command to the test pattern generating apparatus 11, an instruction memory 52 (see FIG. 5) in the program control section 24 is addressed by a control circuit 51 including a program counter and read out. The instruction memory 52 has written therein a program (described in the form of a microprogram) which is transferred from the electronic computer 19 prior to the start of operation. Of the instructions read from the instruction memory 52, an address pattern generate instruction, a data pattern generate instruction and memory control signal bits are provided to the address pattern generator 26, the data pattern generator 27 and the memory control signal generator 28 via the terminals 29, 31 and 32, respectively. When a conditional branch instruction is read from the instruction memory 52 and produced at the terminal 33, the same instruction is read repeatedly from the instruction memory 52 until the condition is fulfilled. For example, when a boundary value loaded in a predetermined internal register in the address pattern generator 26 and the address pattern from the address pattern generator 26 are coincident with each other, the status information generator 25 supplies the control circuit 51 with status information indicating fulfilment of the condition, thus controlling addressing of the instruction memory 52.

Figure 6:
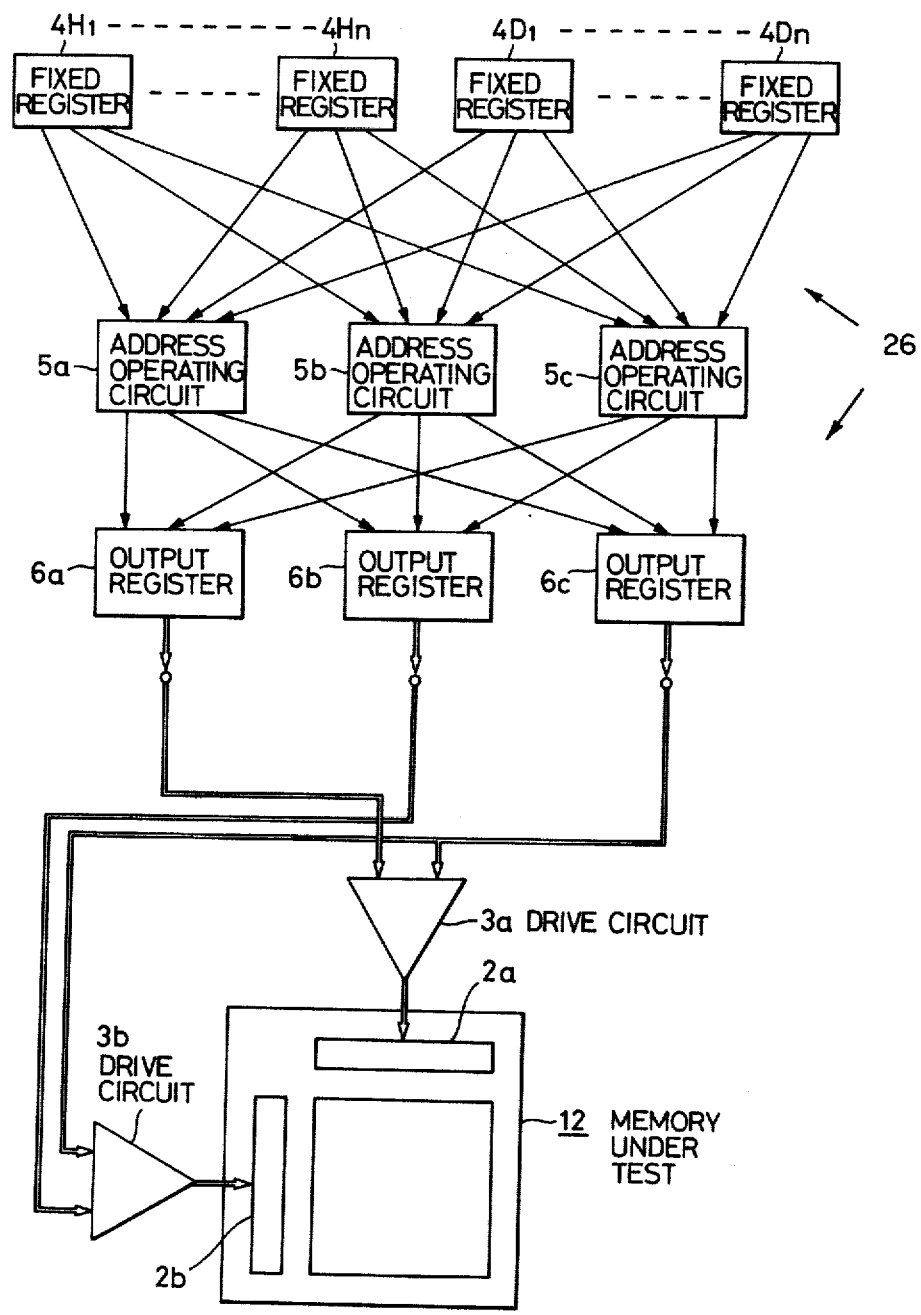
FIG. 6 is a block diagram illustrating an embodiment of the address pattern generator of this invention.

FIG. 6 illustrates an embodiment of the address pattern generator of the present invention. A plurality of fixed registers $4H_1$ to $4H_n$ and $4D_1$ to $4D_n$ are provided in common to a plurality of address operating circuits 5a, 5b and 5c. In the fixed registers $4H_1$ to $4H_n$ are set mainly initial values and boundary values, whereas in the fixed registers $4D_1$ to $4D_n$ are set operands, e.g., incremental values. The outputs from these fixed registers $4H_1$ to $4H_n$ and $4D_1$ to $4D_n$ are provided to the status information generator 25 in FIG. 4. The address operating circuits 5a, 5b and 5c each taken out of the fixed registers $4H_1$ to $4H_n$ and $4D_1$ to $4D_n$ desired ones of the initial values, the boundary values and the operands set therein, in accordance with the operand select instruction included in the address pattern generate instruction. Further, each of the address operating circuits 5a, 5b and 5c performs, in connection with the thus selectively inputted operand, an operation specified by an operate instruction in the address pattern generate instruction.

Output registers 6a, 6b and 6c are provided in common to the address operating circuits 5a, 5b and 5c and are each adapted to be capable of loading therein any one of the operation results of the address operating circuits 5a, 5b and 5c which is selected by an output select instruction in the address pattern generate information.

The address operating circuit 5a is constructed, for example, as shown in FIG. 7. A select circuit 54 such as a multiplexer is supplied with the outputs from the fixed registers $4H_1$ to $4H_n$ and $4D_1$ to $4D_n$ via terminals $56_1$ to $56_p$, respectively, and the operand select instruction included in the address pattern generate instruction derived from the instruction memory 52 at the terminal 29 is applied as a select control signal to the select circuit via a terminal 7a. Accordingly, in accordance with the operand select instruction at the terminal 7a, one of the fixed registers is selected, and the operand loaded therein is supplied to one input side of an arithmetic-logic unit 57. An operate instruction in the address pattern generate instruction provided at terminal 29 is applied via a terminal 8a to the arithmetic-logic unit 57, and in response to the operate instruction, two inputs to the arithmetic-logic unit 57 are added together, subtracted one from the other or OR'ed with each other, or one of the inputs is taken out as it is. The operation result of the arithmetic-logic unit 57 is loaded in an arithmetic register 59 by a clock from a terminal 58. The output from the arithmetic register 59 is applied as the other input to the arithmetic-logic unit 57, and to the status information generator 25 (FIG. 4) via a terminal 42a; furthermore, the output from the arithmetic register 59 is also provided to the output registers 6a, 6b and 6c (FIG. 6) via a terminal 9a.

The address operating circuits 5b and 5c are also identical in construction with the address operating circuit 5a; and the operand select and the operate instruction included in the address pattern generate instruction are applied to the address operating circuits 5b and 5c via terminals 7b, 7c and 8b, 8c respectively.

In the output register 6a, for example, as shown in FIG. 8, the outputs from the address operating circuits 5a, 5b and 5c, that is, the outputs at the terminals 9a, 9b and 9c are applied to a select circuit 61 formed by a multiplexer. The output select instruction in the address pattern generate instruction at the terminal 29 (FIG. 5) is provided as a control signal to the select circuit 61 via a terminal 10a, by which the oeration result from any one of the terminals 9a, 9b and 9c is selected, and the selected operation result is loaded in an internal register 62 by a clock provided from a terminal 63 and, at the same time, it is applied via a terminal 64a to the status information generator 25. The output from the internal register 62 is derived as the output from the output register 6a at a terminal 65a.

The output registers 6b and 6c are also identical in construction with the output register 6a, and the output select instruction in the address pattern generate instruction is applied to the output registers 6b and 6c via terminals 10b and 10c, respectively.

As shown in FIG. 6, the outputs from the output registers 6a and 6b are respectively applied to the drive circuits 3a and 3b, and the output from the output register 6c is applied to both of the drive circuits 3a and 3b. The outputs from the output registers 6a, 6b and 6c correspond to the output derived at the terminal 41 in FIG. 4. Since the bit position arrangement at an input address terminal of each of the drive circuits 3a and 3b may sometimes differ with the kind of the memory 12 under test, the drive circuits 3a and 3b are each capable of rearranging input bits at desired bit positions for input to the memory 12. For example, in the drive circuit 3a, as shown in FIG. 9, the outputs from the output registers 6a, 6b and 6c via the terminals 65a, 65b and 65c are inputted to all of bit select circuits $3a_1, 3a_2, \ldots 3a_r$ to select one bit in each of them in accordance with the content of one of registers $66_1, 66_2, \ldots 66_r$. As a result of this, an r-bit column address is applied to the memory 12 under test. The contents of the registers $66_1$ to $66_r$ are loaded therein beforehand from the electronic computer 19 in accordance with the kind of the memory 12 under test. In FIG. 6, the output from the output register 6b is not applied to the drive circuit 3a; but, in general, the outputs from all of the output registers 6a, 6b and 6c are provided to the drive circuits 3a, as shown in FIG. 9.

Thus, the output from the output register 6a is supplied to, for example, the column address decoder 2a of the memory 12 under test, and the output from the output register 6b is supplied to the row address decoder 2b of the memory 12. The output register 6c is herein assumed to produce address information for selecting the memory parts A to D of the memory 12 under test. Consequently, two bits outputted from the output register 6c are separated, one bit being imparted to a high-order bit of the column address decoder 2a and the other bit being imparted to a high-order bit of the row address decoder 2b.

With such an arrangement, for example, at the moment m, an initial value set in the fixed register $4H_1$ is loaded in the address operating circuits 5a and 5b, by an operand select instruction from the instruction memory 52 (FIG. 5), and the outputs from the address operating circuits 5a and 5b can be outputted via the output registers 6a and 6b at the same time. At this time, it is possible that the address operating circuit 5c does not load therein outputs from any of the fixed registers and outputs 0 via the output register 6c. As a consequence, for example, an address 0 of the memory part A can be accessed. At the moment $m+1$, the address operating circuit 5c responds to the operate instruction from the instruction memory 52 to load an operand set in the fixed register, for example, $4D_1$, and adds this value to the previously inputted value 0 and outputs the operation result via the output register 6c, whereby, for example, an address 0 of the memory part B is accessed. By repetitively adding 1 in the address operating circuit 5c in this way, the same addresses of the memory parts A to D can be successively accessed. After accessing the memory part D, the value 1 of the fixed register $4D_1$ is loaded, for example, in the address operating circuit 5a, wherein the value is added to the previously inputted value, and in this state, the successive addition of 1 is performed in the address operating circuit 5c, thereby stepping the address of each of the memory parts A to D by one address, for example. In this way, the same addresses of the memory parts A to D can be successively accessed, and the addresses can be successively changed.

On top of that, the address operating circuits 5a to 5c are each provided at the input side with a select circuit 54 and are thus capable of loading any of the values set in all of the fixed registers $4H_1$ to $4H_n$ and $4D_1$ to $4D_n$. For example, in the case of stepping the address one by one, the operands of the fixed registers having set therein 1 can be loaded in all the address operating circuits 5a, 5b and 5c; this permits increasing the numbers of selectable initial values, boundary values and operands. As a consequence, flexibility of the patterns generated increases, and a variety of patterns can be generated.

Furthermore, since the output registers 6a, 6b and 6c are capable of loading the operation result of any of the address operating circuits 5a, 5b and 5c, a complicated address modification can be achieved, without introducing a dummy cycle, for example, by loading the operation result of the address operating circuit 5a in the output register 6a at a certain moment and loading the operation result of the address operating circuit 5b in the output register 6a at the next moment.

Moreover, the address pattern generator of this invention has the output register 6c for memory part selection use, so that in the case where after conducting a series of tests on one memory parts, the next memory part is subjected to the same tests, the number of bits of the address operation which are applied to each of the output registers 6a and 6b is small; and in the case where testing of one memory is followed by testing of the next memory, only the address operation whose result is applied to the output register 6c is performed and, for the other address operations, the same operations as those in the test of the previous memory part are merely repeated. Therefore, the address operation is simplified, and the hardware used can also be reduced in size. The present invention is applicable not only to the case of dividing the memory into four memory parts but also to the case of dividing it into more than four parts. Further, this division is not limited specifically to the case where the content of the output register 6c is combined as a high-order bit with the content of each of the output registers 6a and 6b, but may also be such that the content of the output register 6c is combined as a low-order or intermediate-order bit. Even with the provision of only three such output registers, the address pattern generator of the present invention excels the conventional one employing only two output registers; therefore, an address operating circuit may be provided fixedly for each of the output registers 6a, 6b and 6c. In such a case, an address operating unit comprising two arithmetic circuits is coupled fixedly with each of the output registers, as shown in FIG. 2.

It will be apparent that many modifications and variations may be effected without departing from the scope of the novel concepts of this invention.

What is claimed is:

1. An address pattern generator for testing a memory, comprising:
   a plurality of fixed registers respectively having loaded therein an initial value, a boundary value and an operand;
   a plurality of address operating circuits, each selecting a desired one of the fixed registers to take out the value loaded therein and to perform an operation using the value; and
   a plurality of output registers, each selecting a desired one of the address operating circuits to take out its output;
   whereby an address pattern for the memory under test is obtained from the plurality of output registers.

2. An address pattern generator according to claim 1, wherein an operand select instruction in an address pattern generate instruction read from an instruction memory having stored therein a microprogram describing a test pattern to be generated is supplied to each of the address operating circuits, and wherein an operand select circuit is provided in each of the address operating circuits for selecting the desired one of the fixed registers by the operand select instruction to output the content of the selected fixed register.

3. An address pattern generator according to claim 2, wherein there are provided in each of the address operating circuits an arithmetic-logic unit, for performing a logical operation between the value outputted from the operand select circuit and a value set in an internal register in accordance with the operand select instruction in the address pattern generate instruction, and an arithmetic register for storing the operation result and providing it as the output from the address operating circuit.

4. An address pattern generator according to claim 2, wherein an output select instruction in the address pattern generate instruction is supplied to each of the output registers, and wherein there are provided in each of the output registers an output select circuit, for selecting one of the address operating circuits by the output select instruction to output the operated output of the selected address operating circuit, and a register for storing the selected operated output.

5. An address pattern generator for testing a memory, comprising:
   first, second, and third address operating units for performing an operation following an address operate instruction in an address pattern generate instruction read from an instruction memory having stored therein a microprogram describing a test pattern to be generated;
   first, second, and third output registers for respectively storing the outputs from the first to third address operating units;
   a first select circuit for combining the output from the first output register with one part of the output from the third output register to generate a row address of the memory under test; and
   a second select circuit for combining the output from the second output register with the other part of the output from the third output register to generate a column address of the memory under test.

6. An address pattern generator according to claim 5, wherein the first, second, and third address operating units are each provided with at least one address operating circuit, and wherein the first, second, and third output registers are each provided with means for selecting a desired one of the outputs from the address operating circuits.

* * * * *